Oct. 1, 1963 F. L. FEIGIN ET AL 3,105,868

CIRCUIT PACKAGING MODULE

Filed Dec. 29, 1960

INVENTOR.
FRANKLIN L. FEIGIN
BY EGONS RASMANIS
Spencer E. Olson
ATTORNEY 3,105,868
Patented Oct. 1, 1963

3,105,868

CIRCUIT PACKAGING MODULE

Franklin L. Feigin, Worcester, and Egons Rasmanis, Burlington, Mass., assignors to Sylvania Electric Products Inc., a corporation of Delaware Filed Dec. 29, 1960, Ser. No. 79,378
6 Claims. (Cl. 174—68.5)

Figure 1:
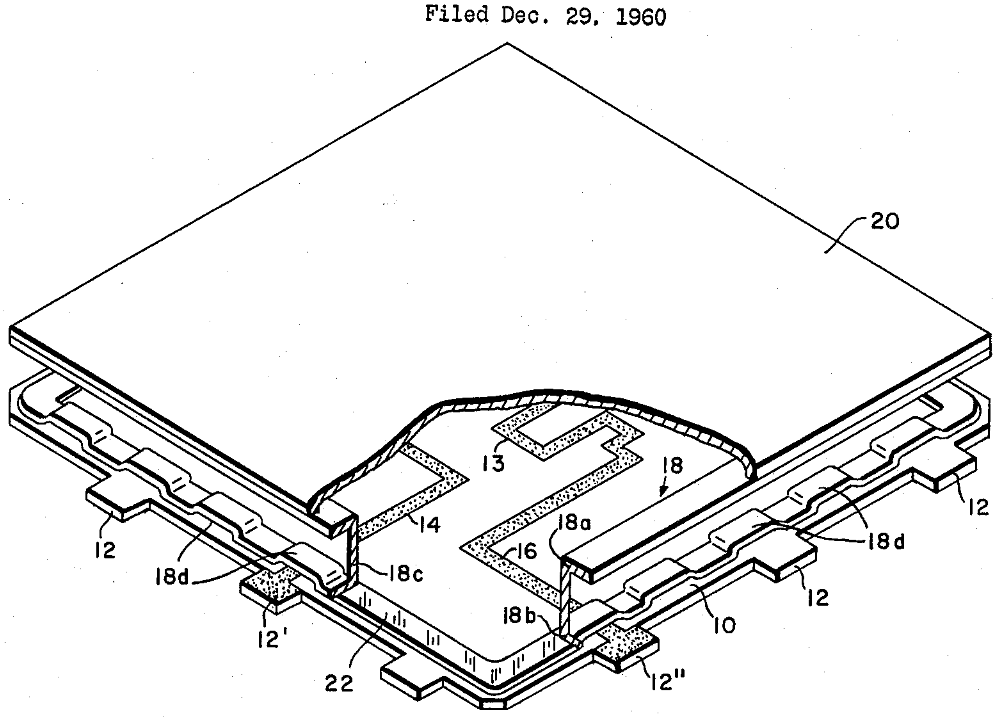

This invention relates to electronic apparatus, and more particularly to the fabrication and interconnection of groups of electrical elements into assemblies known as modules. The invention is especially useful for the production of electronic equipment having high electronic component density and low weight and volume, commonly known as microelectronic circuitry.

Currently, electronic circuit requirements are placing strong emphasis on size and cost reduction with improvement of reliability. Considerable size reduction is being achieved by employing unencapsulated electronic components such as resistors, capacitors, semiconductor diodes, transistors, etc. The supporting structure for such elements has evolved in a variety of forms, all, however, generally consisting of wafer elements on which such circuit components are printed, evaporated, physically attached, or otherwise affixed. With the removal of the normal encapsulation of some of these components, to achieve the requisite reliability it is necessary that the components be protected from their surrounding environment. A particularly suitable way to achieve size reduction while maintaining a high order of reliability is to employ unencapsulated components affixed to a supporting wafer and providing a hermetic seal of transistor quality for all of the components on an individual wafer. Two methods of providing a transistor quality seal are disclosed in copending applications S.N. 796,577, filed March 2, 1959, by Gerald J. Selvin, now Pat. No. 2,995,686, and S.N. 55,238, filed September 12, 1960, by John R. Moore et al., both applications being assigned to the assignee of the present application. In the former application a rigid module is formed of a plurality of wafers, each having a number of circuit components thereon, stacked one on the other and spaced apart with spacer frames of sufficient thickness to separate the circuit elements on each wafer from the next adjacent wafer. The components on the wafers are hermetically sealed from the environment by bonding the spacer frames to the adjacent wafer elements. In the latter application a cover or "hat" formed of glass or metal is placed over the circuit components on the wafer and hermetically sealed about its perimeter to the wafer.

Both of these methods are satisfactory but require some care in fabrication because in each case the final seal requires the use of elevated temperatures in close proximity to the circuit components, some of which are extremely thermal sensitive. It has been observed, for example, that exposure of silicon transistors and diodes to temperatures higher than 300° C., and alloyed germanium transistors to temperatures higher than 150° C., irreversibly change their performance characteristics. Accordingly, it is necessary to provide a hermetic seal for these components having transistor quality wherein the temperature needed for sealing is sufficiently low, or sufficiently removed from the thermal sensitive components, as not to effect the electrical performance characteristics of temperature sensitive circuit components.

Therefore, it is a primary object of the present invention to provide an improved microelectronic package and method of hermetically sealing the same.

Another object of the invention is to provide a microelectronic circuit element of low cost and high reliability.

Still another object of the invention is to provide a microelectronic circuit package having a configuration such that the heat required in making the final hermetic seal does not inversely affect the characteristics of electrical elements contained in the package.

In accordance with the present invention, the cover for the electrical elements on the supporting substrate, preferably a ceramic wafer, is provided by a metal ring formed of U-shaped channel, the legs of which lie in planes generally parallel to the surface of the wafer with the open side of the channel extending outwardly. This ring, which may be formed of copper or any other suitable material is sealed to the wafer by a metal-to-glass-to-ceramic seal which may be carried out in a furnace operation prior to affixing electrical components to the wafer. The leg or side of the channel in contact with the wafer is corrugated at the locations where conductors are brought out from the electrical elements to the periphery of the wafer to prevent shorting of the conductors. Thereafter, the circuit elements are applied to the wafer by evaporation, electroplating, mechanical attachment or any other suitable means of affixing the components to the wafer. Subsequent to the mounting of the components, the final hermetic seal is made by a flat plate attached to the upper leg of the U-shaped channel by welding, soldering, fusion bonding or other available sealing methods. The channel shape of the ring permits the insertion of welding electrodes, or tips, or fixtures to firmly engage the inner surface of the upper leg of the channel to facilitate the handling of the wafer element and the forming of the seal. The location of the seal is sufficiently remote from the electronic components on the wafer that the sealing temperatures involved do not adversely affect the components.

Figure 2:
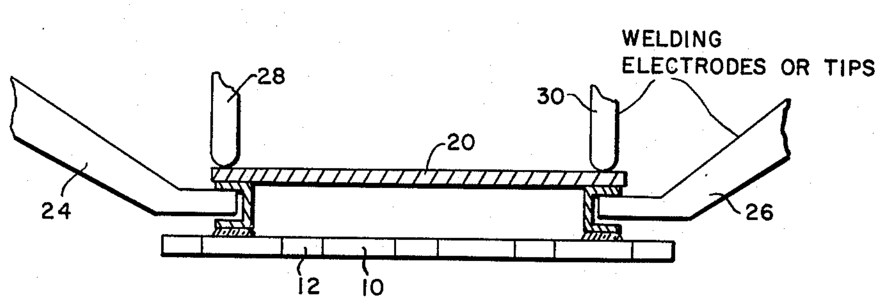

Other objects, features and advantages of the invention will become apparent, and a better understanding of its organization will be had, from the following detailed description taken in conjunction with the accompanying drawings, in which:

FIG. 1 is an isometric view, partially cut away, illustrating the construction of the seal; and FIG. 2 is an elevation cross-section, somewhat diagrammatic, illustrating the manner in which the shape of the ring facilitates the sealing operation.

Referring now to the drawings, FIG. 1 illustrates, greatly enlarged, a microelectronic package embodying the invention, including a flat wafer element 10 on which the circuit elements are affixed. Typical dimensions for the wafer are 0.5 x 0.5 inch with a thickness of 8 to 12 mils. The wafer is formed of rigid insulating material, preferably a high density, high purity alumina, such as No. AD-99, available from the Coors Manufacturing Co., or Al Si Mag No. 652 or No. 614, available from the American Lava Co. The wafer is formed by pressing and firing by techniques known to the art, and initially are insulators. To facilitate assembly into modules as taught in the aforesaid copending applications, the wafer is formed with integral tabs 12 which project from the edges of the wafer in the plane of the wafer. For a one-half inch square wafer it has been found that three tabs along each edge provide adequate separation of electrical connections to the tabs, and permit convenient assembly and interconnection of a plurality of wafer elements. In a typical wafer element, each of the tabs is about 30 to 35 mils wide and projects from the nominal edge of the board about 25 mils.

Each of the wafers constituting a module carries or supports an electrical circuit element or component, or a functional sub-circuit, which is subsequently interconnected with circuit elements on other wafers. For example, a single wafer may carry a single functional resistance-capacitance portion of a circuit, an inductance-capacitance portion of the circuit, or a resistor-diode portion of the circuit, to provide electrical circuit characteristics rather than individual part characteristics. Techniques are now available for printing, etching, plating, or otherwise attaching or depositing circuit elements, such as resistors, capacitors, inductors, and semiconductor diodes and transistors, directly on to a ceramic or glass substrate. These elements and their method of affixing them to the wafer form no part of the present invention. The elements affixed to the substrate, such as the illustrated printed resistor 13, are interconnected by printed or plated interwiring connections, two of which are illustrated at 14 and 16. These conductive paths are applied to the substrate by available printed circuit techniques and are terminated to selected ones of the tabs projecting from the edges of the wafer. In the illustrated example of a sub-circuit having two external terminals, printed conductor 14 is connected to tab 12' and the other is connected to tab 12'' projecting from adjacent edges of the wafer. The tabs selected as terminals are covered with a conductive coating, indicated by stippling, which, for example, may be silver printed on the tab and fired onto and into the substrate material.

In accordance with the present invention, the circuit elements on the wafer 10 and the interwiring 14 and 16 are hermetically sealed from the environment by an enclosure consisting of a ring 18 and a flat metal cover 20. As shown, the ring is of U-shaped cross-section having side surfaces **18*a* and 18*b*, and a bottom surface 18*c*, the dimension of the latter determining the height of the enclosure. The open side of the channel projects toward the outside, with the side surfaces 18*a* and 18*b* disposed substantially parallel to the plane of wafer 10. Side surface 18*b* is corrugated or coined at positions corresponding to the positions of tabs 12 as indicated at 18*d* to allow clearance above the printed conductors 14 and 16 which are brought out through the hermetic seal to be described. While the disclosed assembly shows only two conductors brought out to conductive tabs, other wafers may require additional conductors, possibly connected to different tabs than those shown; accordingly, corrugations 18*d* are provided at all locations of the tabs to make the ring 18 universal for all possible wafer configurations. It will be noted that there are additional corrugations between those opposite the tabs; their purpose is to permit their use in any position relative to the wafer, the tabs on which are not symmetrically located along its edges. The ring 18 is formed of any suitable metal, such as soft copper, and is dimensioned such that the outer periphery of the ring extends to the edge of water 10 or is slightly smaller than the wafer. The height of the ring (dimension of bottom piece 18*c*) may vary depending upon the height of the electrical components to be affixed to the wafer 10, a typical dimension being of the order of 0.0370 inch. The depth of the channel in ring 18 typically is of the order of 0.038 inch. Cover plate 20 has dimensions corresponding to the outer dimensions of ring 18 and is also formed of a suitable metal, such as soft copper. Cover 20 is secured to the upper member 18*a*** of the ring by soldering, welding, or other suitable means, in a manner to be described in more detail later.

In the fabrication of the wafer circuit element, printed conductors 14 and 16 are first applied to wafer 10 by evaporation, electroplating, or firing onto the ceramic wafer, or by other means known to the art. Conductive surfaces are also applied to selected tabs 12' and 12''. Thereafter, a stripe or bead of glass or other non-conducting bonding material 22 is applied around the perimeter of the wafer, over conductors 14 and 16. The glass may be applied in powdered form as a thin line and fired onto the ceramic, or, alternatively, may be applied as a glass pre-form, or flame sprayed onto the substrate. The stripe of glass has sufficient thickness to completely cover and adhere to the conductors 14 and 16. Thereafter, ring 18 is placed on the wafer with side piece **18*b* in register with the glass stripe 22, and fused thereto by suitable means, such as in a furnace. The indentations or corrugations 18*d* straddling conductors 14 and 16 prevent the ring making contact with and shorting out the conductors during the fusion of the ring to the glass stripe, which is usually accompanied by application of pressure to the upper surface of the ring 18. After completion of this high-temperature fabrication of metal-to-glass-to-ceramic seal, the heat sensitive electrical components are applied or affixed to the wafer and electrical connection made to conductors 14 and 16. Thereafter, the metal cover is joined to the upper flange 18*a*** of the ring by soldering, electrical discharge welding, pressure welding, ultrasonic welding, electron beam welding, or other suitable means to form an hermetic seal.

The channel shape of ring 18 facilitates handling of the wafer and is essential to the operation of sealing the cover 20 to the ring. For example, jigs may be formed to extend into and engage the bottom of the channel for positioning the wafer during the application of the electrical components, and, as shown in FIG. 2, welding electrodes or tips 24 and 26 may be inserted in the channel to support the assembly and form a backup for corresponding upper electrodes 28 and 30. As an alternative to electrical or pressure welding, plate 20 may be soldered to the upper flange of channel ring 18. In either case, it will be noted, heat and/or pressure for the sealing operation is applied at a point quite remote from the central portion of the upper surface of wafer 10 on which the electrical elements are applied. Further, because of the thin gauge of the metal of the ring and the plate relatively small amounts of heat are required to make a seal, and when soldering is employed, the area of application of solder is so small that relatively little heat is required. In any event, the remoteness of the rim where the seal is made from the location of the electrical components permits the hermetic seal to be made without harmful effect on the thermal sensitive electrical elements.

After the wafers have been sealed as above described, appropriate wafers are stacked into a module with the tabs on the wafers projecting into slots formed in interwiring boards in a manner described in the aforesaid pending application S.N. 55,238. The interwiring boards may be formed of the same materials as the wafers, with those slots to which connection is to be made to an active tab surrounded by conductive material, and the slots interconnected by printed wiring fired or otherwise affixed to the surface of the boards. Preferably four interwiring boards are used so as to completely enclose the wafers, but a sufficiently rigid module can be fabricated with but two interwiring boards.

While there has been described and shown what is considered to be a preferred embodiment of the invention, various modifications may be made without departing from the true spirit thereof. Accordingly, the invention is to be construed as limited only by the spirit and scope of the appended claims.

What is claimed is:

1. A microcircuit package comprising a wafer formed of insulating material, electrical components affixed to an area on at least one surface of said wafer including a conductor extending outside said area, a metal ring of U-shaped cross-section having side surfaces and a bottom surface defining a channel directed toward the outer perimeter of the ring, an hermetic seal joining one side surface of said ring to said one surface of said wafer at a position to surround said area, said conductors extending through said hermetic seal, and a metal cover conforming in shape to said ring hermetically sealed to the other side surface of said ring.

2. A microcircuit package comprising a wafer having integral tabs projecting from an edge thereof in the plane of the wafer, electrical components affixed to at least one surface of said wafer including a conductor extending to one of said tabs, a metal ring of U-shaped cross-section having side surfaces and a bottom surface defining a channel the open side of which is directed toward the outer perimeter of the ring, an hermetic seal joining one side surface of said ring to said one surface of said wafer at a position to surround said electrical components, said conductors extending through said hermetic seal, and a metal cover conforming in shape to said ring hermetically sealed to the other side surface of said ring.

3. A microcircuit package comprising a ceramic wafer, electrical components affixed to at least one surface of said wafer, said components including a flat conductor affixed to said surface and extending to an edge of said wafer, a metal ring of U-shaped cross-section having substantially parallel side surfaces and a bottom surface defining a channel directed toward the outer perimeter of the ring, said side surfaces being substantially parallel to the plane of said wafer, a metal-to-glass-to-ceramic seal hermetically joining one side surface of said ring to said surface of said wafer at a position to surround said electrical components, said conductors extending through the glass of said seal between said one side surface of said ring and said wafer, and a metal cover conforming in shape to said ring hermetically sealed to the other side surface of said ring.

4. A microcircuit package comprising a rectangular ceramic wafer having integral tabs projecting from an edge thereof in the plane of the wafer, electrical components affixed to a surface of said wafer, said components including a flat conductor affixed to said surface and extending to one of said tabs, a metal ring of rectangular outline and U-shaped cross-section having substantially parallel side surfaces and a bottom surface defining a channel directed toward the outer perimeter of the ring, said side surfaces being substantially parallel to the plane of said wafer, a metal-to-glass-to-ceramic seal hermetically joining one side surface of said ring to said surface of said wafer at a position to surround said electrical components, said conductors extending through the glass of said seal between said one side surface of said ring and said wafer, and a metal cover conforming in shape to said ring welded to the other side surface of said ring to form an hermetic seal.

5. A microcircuit package comprising a thin, square ceramic wafer having spaced integral tabs projecting from an edge thereof in the plane of the wafer, a conductive coating on at least one of said tabs, electrical components affixed to a surface of said wafer including a flat conductor on said surface extending to and connected with the conductive coating on one of said tabs, a metal ring of square outline and U-shaped cross-section having substantially parallel side surfaces and a bottom surface defining a perimetal channel directed outwardly, said side surfaces being substantially parallel to the plane of said wafer, a metal-to-glass-to-ceramic seal hermetically joining one side surface of said ring, around the periphery of the ring, to said surface of said ring at a position to surround said electrical components, said conductors extending through the glass of said seal, and a metal plate conforming in outline to said ring joined to the other side surface of said ring to form an hermetic seal.

6. A microcircuit package comprising a thin, square ceramic wafer having spaced integral tabs projecting from an edge thereof in the plane of the wafer, a conductive coating on at least one of said tabs, electrical components affixed to a surface of said wafer including a flat conductor on said surface extending to and connected with the conductive coating on one of said tabs, a metal ring of square outline and U-shaped cross-section having substantially parallel side surfaces and a bottom surface defining a perimetal channel directed outwardly, said side surfaces being substantially parallel to the plane of said wafer, a metal-to-glass-to-ceramic seal hermetically joining one side surface of said ring, around the periphery of the ring, to said surface of said ring at a position to surround said electrical components, said one side surface of said ring being formed with indentations spaced along the periphery thereof corresponding to the spacing of said tabs, said conductor extending through the glass of said seal, under one of said indentations, and a metal plate conforming in outline to said ring joined to the other side surface of said ring to form an hermetic seal.

References Cited in the file of this patent

UNITED STATES PATENTS 2,995,686 Selvin ---------------- Aug. 8, 1961